(12) United States Patent
Kamoto et al.

(10) Patent No.: US 10,115,689 B2
(45) Date of Patent: Oct. 30, 2018

(54) SEMICONDUCTOR DEVICE AND METHOD FOR MANUFACTURING THE SAME

(71) Applicant: Toshiba Memory Corporation, Tokyo (JP)

(72) Inventors: Taku Kamoto, Oita Oita (JP); Tatsuo Migita, Nagoya Aichi (JP); Shinya Watanabe, Yokkaichi Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/694,998

(22) Filed: Sep. 4, 2017

(65) Prior Publication Data

US 2018/0233468 A1 Aug. 16, 2018

(30) Foreign Application Priority Data

Feb. 10, 2017 (JP) ................................. 2017-023207

(51) Int. Cl.
*H01L 23/00* (2006.01)
(52) U.S. Cl.
CPC ............. *H01L 24/05* (2013.01); *H01L 24/03* (2013.01); *H01L 24/11* (2013.01); *H01L 24/13* (2013.01); *H01L 24/16* (2013.01); *H01L 24/81* (2013.01); *H01L 2224/0225* (2013.01); *H01L 2224/0226* (2013.01); *H01L 2224/0345* (2013.01); *H01L 2224/03452* (2013.01); *H01L 2224/03614* (2013.01); *H01L 2224/0401* (2013.01); *H01L 2224/05124* (2013.01); *H01L 2224/05139* (2013.01); *H01L 2224/05144* (2013.01);

(Continued)

(58) Field of Classification Search
USPC ................... 257/772, 779, E23.015, E23.02, 257/E23.023–E23.079, E21.508–E21.509, 257/E21.519; 438/612–617
See application file for complete search history.

(56) References Cited

U.S. PATENT DOCUMENTS

2010/0187685 A1* 7/2010 Morifuji ............. H01L 23/3128
257/737
2012/0091577 A1* 4/2012 Hwang ................... H01L 24/11
257/737

(Continued)

FOREIGN PATENT DOCUMENTS

JP H0298146 A 4/1990
JP H07118482 B2 12/1995

(Continued)

*Primary Examiner* — Tram H Nguyen
(74) *Attorney, Agent, or Firm* — Patterson & Sheridan, LLP

(57) ABSTRACT

According to one embodiment, a semiconductor device includes a first semiconductor substrate having a first wiring electrode on a first surface thereof, a first protective layer on the semiconductor substrate, having an opening therethrough at the location of first wiring electrode, a first bump electrode in the opening of the first protective layer, the first bump electrode including a base overlying the wiring electrode and an opposed bump receiving surface, and a first bump comprising a bump diameter of 30 μm or less connected to the first bump electrode. The width of the base of the first bump electrode within the opening is equal to or less than 1.5 times the thickness of the first protective layer.

20 Claims, 2 Drawing Sheets

(52) U.S. Cl.
CPC ............ *H01L 2224/05147* (2013.01); *H01L 2224/05155* (2013.01); *H01L 2224/05572* (2013.01); *H01L 2224/05573* (2013.01); *H01L 2224/05666* (2013.01); *H01L 2224/05681* (2013.01); *H01L 2224/11462* (2013.01); *H01L 2224/13026* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/13564* (2013.01); *H01L 2224/13611* (2013.01); *H01L 2224/13616* (2013.01); *H01L 2224/13639* (2013.01); *H01L 2224/13644* (2013.01); *H01L 2224/13647* (2013.01); *H01L 2224/13655* (2013.01); *H01L 2224/13664* (2013.01); *H01L 2224/16145* (2013.01); *H01L 2224/81203* (2013.01); *H01L 2924/014* (2013.01); *H01L 2924/04941* (2013.01); *H01L 2924/04953* (2013.01); *H01L 2924/05042* (2013.01); *H01L 2924/05442* (2013.01); *H01L 2924/07025* (2013.01); *H01L 2924/3656* (2013.01)

(56) References Cited

U.S. PATENT DOCUMENTS

| | | | | |
|---|---|---|---|---|
| 2014/0191391 | A1* | 7/2014 | Chuang | H01L 24/81 257/737 |
| 2014/0217580 | A1* | 8/2014 | Myung | H01L 24/13 257/737 |
| 2015/0021759 | A1* | 1/2015 | Chen | H01L 24/14 257/737 |
| 2016/0027754 | A1* | 1/2016 | Katagiri | H01L 24/02 257/737 |
| 2016/0100482 | A1* | 4/2016 | Kunieda | H05K 3/4007 174/257 |
| 2016/0322319 | A1* | 11/2016 | Aoki | H01L 24/11 |
| 2016/0322321 | A1* | 11/2016 | Yajima | H01L 24/13 |
| 2017/0040243 | A1* | 2/2017 | Fujii | H01L 24/29 |
| 2017/0229421 | A1* | 8/2017 | Tseng | H01L 24/81 |

FOREIGN PATENT DOCUMENTS

| | | |
|---|---|---|
| JP | H11186262 A | 7/1999 |
| JP | 2007-250561 | 9/2007 |
| WO | 2005101475 A1 | 10/2005 |

\* cited by examiner

SEMICONDUCTOR DEVICE AND METHOD FOR MANUFACTURING THE SAME

CROSS-REFERENCE TO RELATED APPLICATION

This application is based upon and claims the benefit of priority from Japanese Patent Application No. 2017-023207, filed Feb. 10, 2017, the entire contents of which are incorporated herein by reference.

FIELD

Embodiments described herein relate generally to a semiconductor device and a method for manufacturing the same.

BACKGROUND

During manufacture of semiconductor devices, when a substrate having a semiconductor device formed thereon is flip-chip connected via bumps to a substrate having another semiconductor device or a wiring formed thereon, bumps provided on one substrate are connected to electrodes previously formed on the surface of the other substrate. As a result, electrodes are formed which are embedded in respective openings formed on the surface of the substrate, so that the surface of an electrode may form a concave surface along the opening. When a bump is connected to an electrode having a concave surface, a gas such as air may get stuck in the concave portion, so that a void in some cases occurs at the resulting junction.

DETAILED DESCRIPTION

Figure 1:
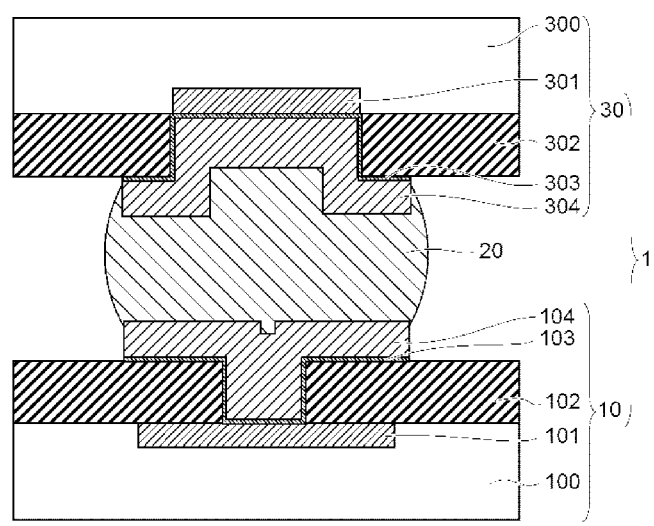
FIG. 1 is a sectional view illustrating the configuration of the semiconductor device according to the embodiment.

Embodiments provide a semiconductor device having substrate junction regions that are more reliable and a method for manufacturing the same.

In general, according to one embodiment, a semiconductor device includes a first semiconductor substrate having a first wiring electrode on a first surface thereof, a first protective layer on the semiconductor substrate, having an opening therethrough at the location of first wiring electrode, a first bump electrode in the opening of the first protective layer, the first bump electrode including a base overlying the wiring electrode and an opposed bump receiving surface, and a first bump comprising a bump diameter of 30 µm or less connected to the first bump electrode. The width of the base of the first bump electrode within the opening is equal to or less than 1.5 times the thickness of the first protective layer.

Hereinafter, an embodiment of the present disclosure will be described.

Embodiment

A semiconductor device according to the embodiment is described with reference to FIG. 1, FIGS. 2A to 2C, and FIGS. 3A to 3D. Furthermore, in the following illustration in the drawings, the same components shown in different drawing figures are denoted by the same reference numerals. However, for example, a relationship between the thickness and the planar size and a ratio therebetween illustrated in the drawings may be different than those of an actual device.

A configuration of the semiconductor device according to the embodiment is described with reference to FIG. 1. FIG. 1 is a sectional view illustrating the configuration of the semiconductor device according to the embodiment.

As illustrated in FIG. 1, a semiconductor device 1 according to the embodiment includes a first semiconductor device 10 and a second semiconductor device 30, and the first semiconductor device 10 and the second semiconductor device 30 are joined to each other by a conductive bump 20 and are thereby electrically connected to each other.

The first semiconductor device 10 includes a first semiconductor substrate 100 such as a silicon substrate, a first wiring electrode 101, a first protective layer 102, a first barrier film 103, and a first bump electrode 104.

The first semiconductor substrate 100 is provided with, although not illustrated, a semiconductor element, a conducting wiring layer made from, for example, copper (Cu) and electrically connected to the element, and an interlayer insulating layer. The first wiring electrode 101, which is connected to the semiconductor element via the wiring layer, is formed on the surface of the first semiconductor substrate 100. The first wiring electrode 101 is a conductor made from, for example, aluminum (Al), Cu, nickel (Ni), gold (Au), silver (Ag), or an alloy of some or all of them.

The first protective layer 102, which has electrical insulation properties, is formed on the first wiring electrode 101. The first protective layer 102 includes, for example, a single layer of any one of, for example, a silicon dioxide film, a silicon nitride film, and a polyimide film or a plurality of layers of some or all of them. The film thickness of the first protective layer 102 is 5 µm or more. Setting the film thickness of the first protective layer 102 to 5 µm or more enables effectively protecting an internal structure, such as a semiconductor element and a wiring layer, formed in the first semiconductor substrate 100. The first protective layer 102 has an opening formed therethrough opening to the first wiring electrode 101.

The first barrier film 103 is formed on the bottom surface and side surface of the opening of the first protective layer 102 and an upper portion of the first protective layer 102 near the opening. The first barrier film 103 includes, for example, a single layer of any one of, for example, titanium (Ti), titanium nitride (TiN), tantalum (Ta), and tantalum nitride (TaN) or a stacked layer of some or all of them, and is formed with a uniform film thickness. Furthermore, in some cases, the first barrier film 103 does not need to be formed.

The first bump electrode 104 is formed on the first barrier film 103, and the opening of the first protective layer 102 is filled with the first bump electrode 104. The first bump electrode 104 includes, for example, a single layer of any one of Cu, Ni, Au, Ag, palladium (Pd), and Al and an alloy of some or all of them or a stacked layer of some or all of them, and is, for example, a Cu pillar layer includes a stacked layer of a Cu plating seed layer and a Cu plated layer.

The film thickness of the first bump electrode 104 is 3 μm or less. The film thickness as used herein refers to the film thickness of a portion of the first bump electrode 104 provided on the first protective layer 102. In the case of a semiconductor device having a plurality of semiconductor substrates stacked in layers, setting the film thickness of the first bump electrode 104 to 3 μm or less enables reducing the distance between the semiconductor substrates and thus minimizing the entire height or thickness of the semiconductor device.

The width or diameter of the opening in the first protective layer 102 is 5 μm or less. In a case where the first barrier film 103 is formed inside the opening, it is desirable that the width or diameter of the opening inside which the first barrier film 103 is formed be 5 μm or less. In other words, it is desirable that the diameter of the bottom surface of the first bump electrode 104 embedded in the opening be 5 μm or less. Here, while the width of the bottom surface of the first bump electrode 104 embedded in the opening only needs to be 5 μm or less in a specific direction, it is further desirable that the width thereof be 5 μm or less in any direction.

Since the opening width is decreased in this way, when the first bump electrode 104 is formed and embedded in the opening, the amount of recessing of the exposed surface of the first bump electrode 104 extending inwardly of the upper surface of the first bump electrode 104 above the opening can be reduced. The amount of recessing of the surface of the first bump electrode 104 as used herein refers to a difference between the uppermost portion and the lowermost portion of the upper surface of the first bump electrode 104, i.e., the depth of the recess.

If the depth of a recess extending into the electrode surface to which a bump is joined becomes 3 μm to 5 μm or more, air may get stuck in between the electrode and the bump or inside the bump, so that avoid is likely to occur. If the void occurs, the electrical resistance at the junction of the bump 20 and the barrier 103 increases or the physical reliability of the junction therebetween deteriorates, or both. In the present embodiment, since the diameter or width of the bottom surface of the first bump electrode 104 embedded in the opening is equal to or less than the film thickness of the first protective layer 102, the opening can be sufficiently closed by the first bump electrode 104, so that the amount of recessing of the surface of the first bump electrode 104, i.e., the depth of a recess thereinto, can be reduced to 1.0 μm or less and no more than 5 to 10 percent of the first bump diameter. Furthermore, even when the diameter of the bottom surface of the first bump electrode 104 embedded in the opening is set equal to or less than 1.5 times the film thickness of the first protective layer 102, the depth of the recessing of the surface of the first bump electrode 104 can be reduced to 1.5 μm or less.

The bump 20 is formed on the first bump electrode 104. The material of the bump 20 includes Cu, tin (Sn), lead (Pb), Au, Ag, Pd, Ni, or an alloy of some or all of them. The bump 20 is a micro-bump with a bump diameter of 30 μm or less, and the distance between the center of the bump 20 and the center of at least one other bump provided adjacent thereto on the same surface side of the first semiconductor device 10 (referred to as a bump pitch) is set to such a small value as 60 μm or less, so that the size of the entire semiconductor device can be minimized.

Usually, in a case where the bump diameter is 80 μm, 100 μm, or 150 μm or larger, since a void occurring at the junction between the bump and the bump electrode is relatively small as compared with the size of the bump, there is little problem with the reliability of junction. On the other hand, in a case where a micro-bump with a bump diameter of 30 μm or less is used, since a void occurring in a junction portion between the bump and the bump electrode is relatively large as compared with the total size of the bump, a problem with the reliability of junction is more likely to occur.

In the semiconductor device 1 according to the present embodiment, since, while miniaturization is attained by using a micro-bump, the amount of recessing of the surface of the first bump electrode 104 is reduced by adjusting the film thickness of the first protective layer 102 and the diameter of the first bump electrode 104 to the respective appropriate values, and a void is prevented from occurring at a junction portion between the bump and the bump electrode as illustrated in FIG. 1, or the size of a void occurring at the junction is sufficiently reduced, so that the reliability of junction is improved.

The second semiconductor device 30 is joined to the first semiconductor device 10 via the bump 20. The second semiconductor device 30 includes a second semiconductor substrate 300 such as a silicon substrate, a second wiring electrode 301, a second protective layer 302, a second barrier film 303, and a second bump electrode 304.

The second semiconductor substrate 300 is provided with, although not illustrated, a semiconductor element, a conducting wiring layer made from, for example, Cu and electrically connected to the element, and an interlayer insulating layer. The second wiring electrode 301, which is connected to the semiconductor element via the Cu wiring layer, is formed on the surface of the second semiconductor substrate 300. The second wiring electrode 301 is an electrical conducting material made from, for example, Ni, Au, Cu, or Al.

The second protective layer 302, which has electrical insulation properties, is formed on the second wiring electrode 301. The second protective layer 302 includes, for example, a single layer of anyone of, for example, silicon dioxide film, silicon nitride film, and polyimide or a plurality of layers of some or all of them. As with the first protective layer 102, setting the film thickness of the second protective layer 302 to 5 μm or more enables effectively protecting an element structure on the second semiconductor substrate 300. The second protective layer 302 has an opening formed on the second wiring electrode 301.

The second barrier film 303 is formed on the bottom surface and side surface of the opening of the second protective layer 302 and an upper portion of the second protective layer 302 near the opening. The second barrier film 303 can employ the same material and structure as those of the first barrier film 103. Furthermore, the second barrier film 303 does not necessarily need to be formed.

The second bump electrode 304 is embedded in the opening of the second protective layer 302 on the second barrier film 303. The second bump electrode 304 employs the same material or structure as that of the first bump electrode 104, and the film thickness thereof is set to 3 μm or less as with the first bump electrode 104, so that the entire semiconductor device can be minimized.

The bump 20 is connected to the second bump electrode 304, thereafter melted, and the second semiconductor device 30 and the first semiconductor device 10 are then electrically and physically connected to each other via the bump 20.

Next, a method for manufacturing the semiconductor device according to the present embodiment is described with reference to FIGS. 2A to 2C and FIGS. 3A to 3D. FIGS. 2A to 2C and FIGS. 3A to 3D are process sectional views illustrating the method for manufacturing the semiconductor device according to the present embodiment.

Figure 2A:
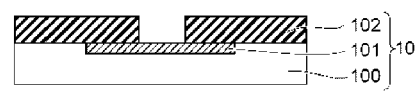
FIGS. 2A to 2C are diagrams illustrating sectional view of the semiconductor device during steps of the method for manufacturing thereof.

First, as illustrated in FIG. 2A, in the method the first semiconductor substrate 100 of the first semiconductor device 10 is prepared. The first semiconductor substrate 100 is provided with, although not illustrated, a semiconductor element, a conducting wiring layer made from, for example, Cu and electrically connected to the element, and an interlayer insulating layer. The method forms the first wiring electrode 101, which is electrically connected to the semiconductor element through the wiring layer, on the surface of the first semiconductor substrate 100. The method further forms the first protective layer 102 with a film thickness of 5 μm by, for example, a chemical vapor deposition (CVD) method in such away as to cover the first wiring electrode 101 on the surface of the first semiconductor substrate 100. After that, the method forms an opening with an opening diameter of about 5 μm in the first protective layer 102 by lithography and dry etching, thus exposing a portion of the first wiring electrode 101 within the opening.

Figure 2B:
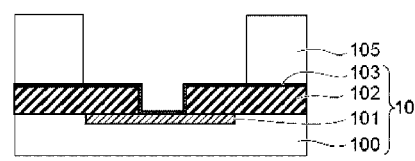

Next, as illustrated in FIG. 2B, the first barrier film 103 is formed on the upper surface of the first protective layer 102 and the bottom surface and side surface of the opening by, for example, a sputtering method. Then, after forming a photoresist 105 on the first barrier film 103, the method forms an opening in the photoresist 105, thus exposing a portion of the first barrier film 103 within the opening.

Figure 2C:
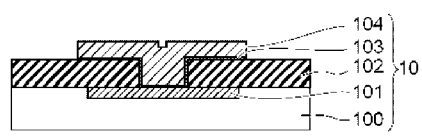

After that, as illustrated in FIG. 2C, the first bump electrode 104 is formed on the first barrier film 103 exposed in the opening of the photoresist 105 by using an electroplating method, so that the first bump electrode 104 is formed in the opening of the first protective layer 102, and over adjacent surfaces of the first bump electrode. The material of the first bump electrode 104 is Cu, and the film thickness thereof is set to 3 μm. At this time, while a minutely sized recess portion occurs on the surface of the first bump electrode 104 above the opening in the first protective layer 102, the depth of recessing is reduced. After forming the first bump electrode 104, the method removes the photoresist 105 by ashing, and further removes an exposed portion of the first barrier film 103. In the above-described way, as illustrated in FIGS. 2A to 2C, the method produces the first semiconductor device 10.

Figure 3A:
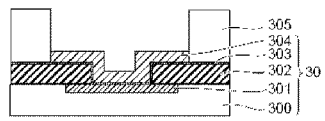
FIGS. 3A to 3D are diagrams illustrating sectional view of the semiconductor device during steps of the method for manufacturing thereof.

Next, as illustrated in FIG. 3A, the second semiconductor device 30 is prepared by a method similar to that for the first semiconductor device 10. The second wiring electrode 301, the second protective layer 302, the second barrier film 303, the photoresist 305, and the second bump electrode 304 are formed on the second semiconductor substrate in that order.

Figure 3B:
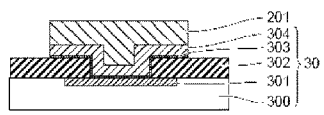

Thereafter, as illustrated in FIG. 3B, a solder layer 201 made from, for example, a Sn alloy is formed on the second bump electrode 304 in the opening of the photoresist 305 by electroplating. After forming the solder layer 201, both the photoresist 305 and a portion of the second barrier film 303 located below the photoresist 305 are removed.

Figure 3C:
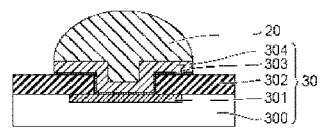

Next, as illustrated in FIG. 3C, the method melts the solder layer 201 by a heating treatment to form the bump 20 on the second semiconductor device 30. The bump 20 thus formed is a micro-bump with a bump diameter of 30 μm or less. Furthermore, although not illustrated, a plurality of bumps 20 is concurrently formed on the same surface side of the second semiconductor substrate 300, and each inter-bump distance is 60 μm or less.

Figure 3D:
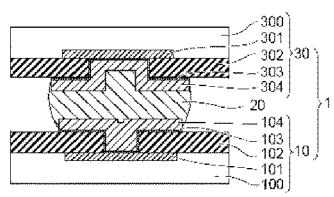

Finally, as illustrated in FIG. 3D, the bump 20 formed on the second semiconductor device 30 is pressed against the first bump electrode 104 of the first semiconductor device 10 by thermocompression bonding and, after that, the bump 20 is allowed to cool or is actively, cooled, thus joining the first semiconductor device 10 and the second semiconductor device 30 to each other via the bump 20. While a recess portion is formed on the surface of the first bump electrode 104, since the depth of the recess portion is small, air is unlikely to get stuck between the bum electrode surface, including within the recess, and the material of the bump, in the process of thermocompressively bonding the bump 20 to the first bump electrode 104 and thus no void occurs, so that the reliability of junction can be increased.

Furthermore, other bump junction techniques include a known technique to previously form a bump also on the first semiconductor device and join the bump on the first semiconductor device and the bump on the second semiconductor device to each other. On the other hand, in the method for manufacturing the semiconductor device according to the present embodiment, since a bump is formed only on the second semiconductor device to be joined to the first semiconductor device, the amount of solder used can be decreased.

Figure 4:
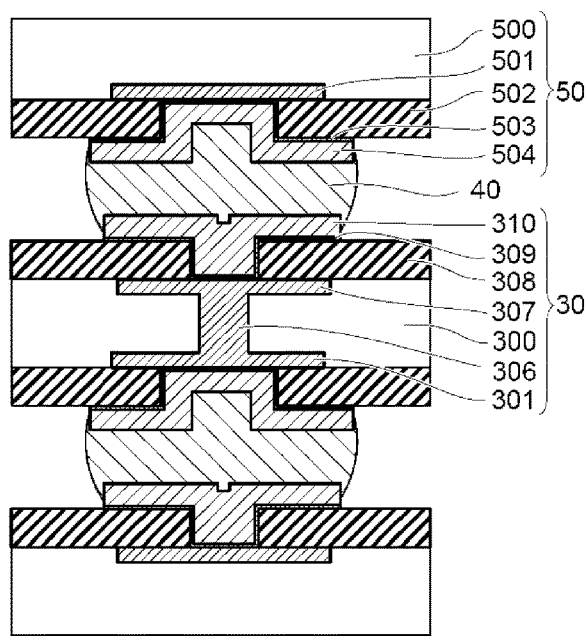
FIG. 4 is a diagram illustrating a sectional view of a semiconductor device according to a modification example of the embodiment.

FIG. 4 is a diagram illustrating a modification example of a configuration of the semiconductor device in the present embodiment. As illustrated in FIG. 4, the semiconductor device according to the modification example has a configuration in which a third semiconductor device 50 is stacked on the second semiconductor device 30 of the semiconductor device illustrated in FIG. 1 via a bump 40.

In the second semiconductor device 30, a conductive via 306 extending in a substrate penetrating direction is formed through the second semiconductor substrate 300. The via 306 is made from a conductive material such as Cu and is electrically connected to the second wiring electrode 301 at the end portion thereof on the side of the first semiconductor device 10. Moreover, the via 306 is also electrically connected to a second wiring electrode 307 at the end portion on the opposite side thereof.

A second protective layer 308, a second barrier film 309, and a second bump electrode 310 are provided on the second wiring electrode 307 with configurations, materials, sizes, and locations similar to those of the first protective layer 102, the first barrier film 103, and the first bump electrode 104 in the first semiconductor device 10. Here, the amount of recessing on the surface of the second bump electrode 310 is sufficiently reduced as with the amount of recessing on the surface of the first bump electrode 104.

The bump 40, which has conductive property, is joined to the upper surface of the second bump electrode 310, and the third semiconductor device 50 is joined to the upper surface of the bump 40. The third semiconductor device 50 is similar in configuration, material, size, and location to the second semiconductor device 30 and includes a third semiconductor substrate 500 such as a silicon substrate, a third wiring electrode 501, a third protective layer 502, a third barrier film 503, and a third bump electrode 504. The bump 40 is used to join the second bump electrode 310 and the third bump electrode 504 to each other to establish electrical connection between the second semiconductor device 30 and the third semiconductor device 50.

In the above-described semiconductor device according to the modification example, since a via extending through a substrate is provided, three or more semiconductor devices stacked in layers are electrically connected to each other while the resulting device is kept compact. Furthermore, since the occurrence of a void in a bump junction can be reduced, the reliability of junction can be increased.

While certain embodiments have been described, these embodiments have been presented by way of example only, and are not intended to limit the scope of the inventions . Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first semiconductor substrate having a first wiring electrode on a first surface thereof;
a first protective layer on the semiconductor substrate, having an opening therethrough at the location of first wiring electrode;
a first bump electrode in the opening of the first protective layer, the first bump electrode including a base overlying the wiring electrode and an opposed bump receiving surface; and
a first bump comprising a bump diameter of 30 µm or less connected to the first bump electrode,
wherein the width of the base of the first bump electrode within the opening is equal to or less than 1.5 times the thickness of the first protective layer.

2. The semiconductor device according to claim 1, wherein the width of the base of the first bump electrode within the opening is equal to or less than the film thickness of the first protective layer.

3. The semiconductor device according to claim 1, wherein the first bump electrode is also located on the first protective layer, and the film thickness of the first bump electrode on the first protective layer is 3 µm or less.

4. The semiconductor device according to claim 1, further comprising a plurality of bumps on the first surface, wherein the distance between the first bump and an adjacent bump is 60 µm or less.

5. The semiconductor device according to claim 1, wherein the bump receiving surface of the first bump electrode includes a recess extending inwardly thereof, and the width of the recess is 1.5 µm or less.

6. The semiconductor device according to claim 5, wherein the width of the recess is 1.0 µm or less.

7. The semiconductor device according to claim 1, wherein the first bump electrode comprises copper.

8. A method of manufacturing a semiconductor device, comprising:
providing a semiconductor substrate comprising a first surface having a first protective layer thereon having a first opening therethrough, and a first bump electrode in the first opening, the first bump electrode having a bump receiving surface, the opening having a width in the direction of the first surface of the substrate less than or equal to 1.5 times the thickness of the first protective layer; and
joining a bump having a bump diameter of 30 µm or less to the bump receiving surface of the first bump electrode.

9. The method according to claim 8, wherein the first protective layer has a thickness of 3.0 µm or less.

10. The method according to claim 8, wherein the bump receiving surface of the first bump electrode includes a recess extending thereinto, and the depth of the recess is 1.5 µm or less.

11. The method according to claim 10, wherein a void is not present between the bump receiving surface of the first bump electrode and the bump, or within the bump.

12. The method according to claim 8, wherein the bump comprises solder.

13. The method according to claim 12, wherein the bump electrode comprises copper.

14. The method according to claim 8, wherein:
the first protective layer further comprises a second opening therethrough having a second bump electrode therein disposed adjacent to the first bump electrode, and a bump thereon, and the distance between the bumps on the first and second bump electrodes is 60 µm or less.

15. A semiconductor device comprising:
a first semiconductor substrate including a first surface thereon;
a wiring layer on the first surface of the first semiconductor substrate;
a protective layer overlying the first surface of the first semiconductor substrate, the protective layer having a thickness of no more than 3.0 µm and including a first opening therethrough overlying, and exposing, the wiring layer;
a first bump electrode located in the first opening and along a portion of the surface of the protective layer adjacent to the opening, wherein the maximum dimension of the first bump electrode in the opening in the direction along the first surface of the first semiconductor substrate is 1.5 times the thickness of the protective layer; and
a bump on the first bump electrode.

16. The semiconductor device according to claim 15, further comprising:
a second semiconductor substrate including a first surface thereon;
a wiring layer on the first surface of the second semiconductor substrate;
a protective layer overlying the first surface of the second semiconductor substrate, the protective layer having a first opening therethrough overlying, and exposing, the wiring layer;
a second bump electrode located in the first opening and along a portion of the surface of the protective layer adjacent to the opening, wherein
the bump that is on the first bump electrode contacts the second bump electrode.

17. The semiconductor device according to claim 16, wherein the bump has a diameter of 30 µm or less.

18. The semiconductor device according to claim 16, wherein the protective layer overlying the first surface of the second semiconductor substrate has a thickness of no more than 3.0 µm.

19. The semiconductor device according to claim 18, wherein the maximum dimension of the second bump electrode in the opening in the direction along the first surface of the second semiconductor substrate is 1.5 times the thickness of the protective layer on the first surface of the second semiconductor substrate.

20. The semiconductor device according to claim 16, wherein the first and second bump electrodes comprise copper.

* * * * *